United States Patent
Takasou et al.

(10) Patent No.: US 7,457,336 B2
(45) Date of Patent: Nov. 25, 2008

(54) LASER DIODE DRIVE CIRCUIT

(75) Inventors: Jun Takasou, Tokyo (JP); Norio Higashisaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 43 days.

(21) Appl. No.: 11/549,984

(22) Filed: Oct. 17, 2006

(65) Prior Publication Data

US 2007/0263685 A1 Nov. 15, 2007

(30) Foreign Application Priority Data

May 11, 2006 (JP) ............................... 2006-132234

(51) Int. Cl.
*H01S 3/00* (2006.01)
(52) U.S. Cl. .................. 372/38.02; 372/38.07
(58) Field of Classification Search .............. 372/38.02, 372/38.07
See application file for complete search history.

(56) References Cited

U.S. PATENT DOCUMENTS

| | | | | |
|---|---|---|---|---|
| 4,809,286 | A * | 2/1989 | Kollanyi et al. .......... | 372/38.07 |
| 5,115,147 | A * | 5/1992 | Kusano et al. .............. | 327/109 |
| 6,778,571 | B2 * | 8/2004 | Vaughan ..................... | 372/38.1 |
| 6,862,306 | B2 * | 3/2005 | Shimizu ................... | 372/38.02 |
| 7,031,359 | B2 * | 4/2006 | Satou et al. .............. | 372/38.02 |
| 7,035,303 | B2 * | 4/2006 | Wang ....................... | 372/38.02 |
| 7,145,929 | B2 * | 12/2006 | Bergmann et al. ........ | 372/38.02 |
| 2006/0187983 | A1 * | 8/2006 | Baba et al. ............... | 372/38.07 |

FOREIGN PATENT DOCUMENTS

| | | |
|---|---|---|
| JP | 10-145221 A | 5/1998 |
| JP | 2002-111118 | 4/2002 |

OTHER PUBLICATIONS

Sean Morley, "A 3V 10.7 Gb/s Differential Laser Diode Driver with Active Back-Termination Output Stage", *International Solid-State Circuits Conference 2005*, Session 12, pp. 220-221, plus presentation slides, (2005).

* cited by examiner

*Primary Examiner*—Minsun Harvey
*Assistant Examiner*—Yuanda Zhang
(74) *Attorney, Agent, or Firm*—Leydig, Voit & Mayer, Ltd.

(57) ABSTRACT

A laser diode drive circuit includes a first transistor having a collector connected to an anode of a laser diode; a second transistor having a collector connected to a cathode of the laser diode; a constant current circuit connected between a ground point and emitters of the first and second transistors; a first high-pass filter connected between the base and the collector of the first transistor; and a second high-pass filter connected between the base and the collector of the second transistor.

4 Claims, 6 Drawing Sheets

LASER DIODE DRIVE CIRCUIT

FIELD OF THE INVENTION

The present invention relates to a drive circuit for driving a laser diode, and more particularly to a laser diode drive circuit that is capable of reliably canceling noise generated by the laser diode and that is easy to design.

BACKGROUND ART

In recent years, there has been a reduction in the power supply voltage of transmitter optical sub-assemblies (TOSAs) employing a laser diode, which are incorporated in communications devices using optical fibers (see, e.g., Japanese Laid-Open Patent Publication No. 2002-111118). As a result, the transmission line to the laser diode has been adapted to provide 25 O impedance matching, instead of 50 O impedance matching. Furthermore, to further reduce the power supply voltage, there is a tendency to reduce or eliminate the matching resistance of the laser diode side while still using a 25 O transmission line. That is, although a standardized 25 O transmission line is used, the total matching resistance of the laser diode side is reduced to 7 O, which is the value of the internal resistance of the laser diode. This leads to mismatches among the matching resistance value of the laser diode side, the characteristic impedance of the transmission line, and the matching resistance value of the drive circuit side, resulting in degraded reflection characteristics and increased noise and jitter in the output optical waveform signal.

In order to increase the resistance to external noise, the drive circuit has been adapted to perform an active matching operation. An active matching operation is an operation performed to cancel noise coming from the laser diode. This operation allows the optical waveform signal to be shaped such that it includes reduced noise and jitter.

In a conventional drive circuit, an emitter follower circuit is provided on the input side of the final stage amplifier circuit so as to form a feedback path for active matching operation. However, this feedback path is long, resulting in an increased time constant. As a result, the response speed of the active matching operation to cancel noise produced by the laser diode is low, which prevents the noise from being reliably canceled. Furthermore, it is very difficult to match these circuits in a high frequency range (e.g., in the 10 Gbps region).

SUMMARY OF THE INVENTION

The present invention has been devised to solve the above problems. It is, therefore, an object of the present invention to provide a laser diode drive circuit that is capable of reliably canceling noise generated by the laser diode and that is easy to design.

A laser diode drive circuit of the present invention includes: a first transistor having a collector connected to an anode of a laser diode; a second transistor having a collector connected to a cathode of the laser diode; a constant current circuit connected between a ground point and emitters of the first and second transistors; a first high-pass filter connected between a base and the collector of the first transistor; and a second high-pass filter connected between a base and the collector of the second transistor.

The present invention allows the length of the feedback path to be reduced, as compared to conventional techniques, resulting in a reduced time constant. This increases the response speed of the active matching operation to cancel noise from the laser diode, allowing for reliable cancellation of the noise. Further, it is easy to establish circuit settings identical to those in a simulation even in a high frequency range, leading to easy circuit design.

DETAILED DESCRIPTION OF THE PREFERRED EMBODIMENTS

First Embodiment

Figure 1:
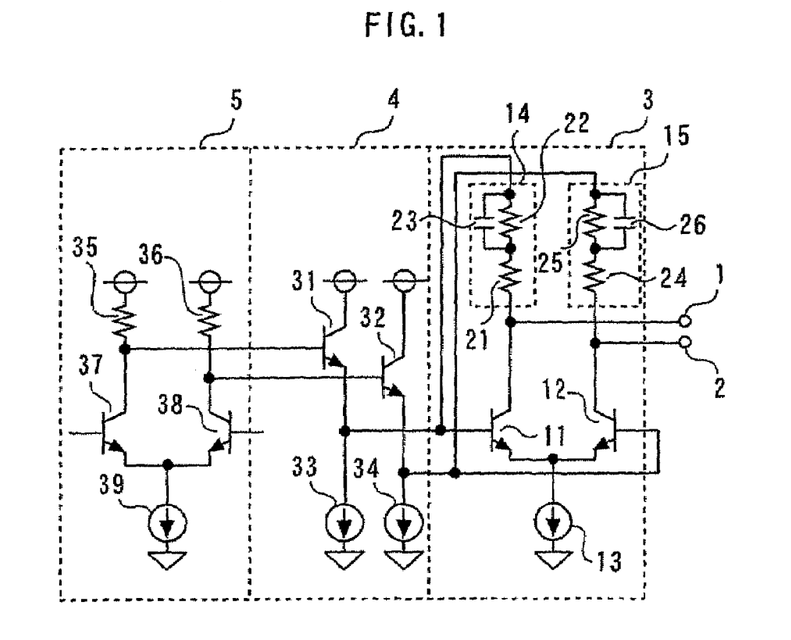
FIG. 1 is a circuit diagram showing a drive circuit according to a first embodiment of the present invention.
Figure 2:
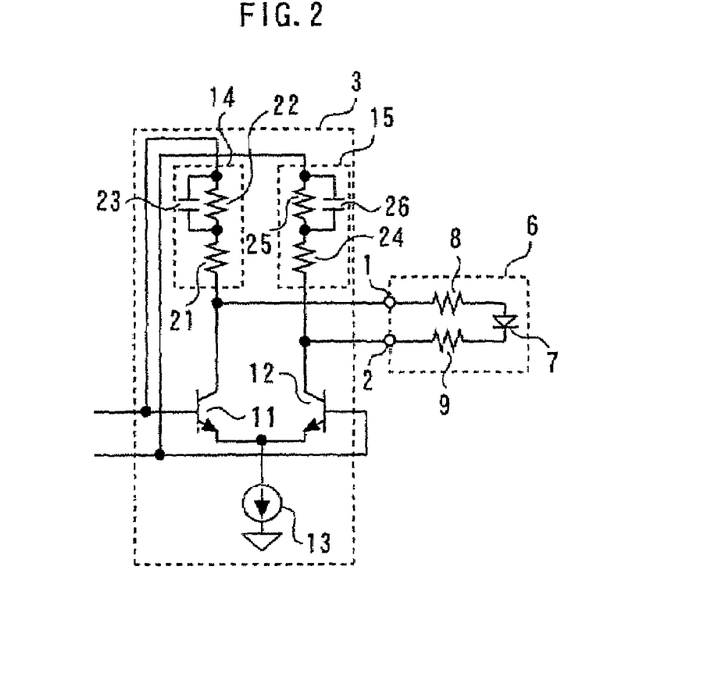
FIG. 2 is a circuit diagram showing a TOSA to which the drive circuit shown in FIG. 1 is connected.

FIG. 1 is a circuit diagram showing a drive circuit according to a first embodiment of the present invention, and FIG. 2 is a circuit diagram showing a TOSA to which the drive circuit shown in FIG. 1 is connected.

The drive circuit includes output terminals 1 and 2, a final stage amplifier circuit 3, a first emitter follower circuit 4 provided on the input side of the final stage amplifier circuit 3, and an amplifier circuit 5 provided on the input side of the first emitter follower circuit 4.

On the other hand, the TOSA 6 includes a laser diode 7, a matching resistance 8 connected to the anode of the laser diode 7, and a matching resistance 9 connected to the cathode of the laser diode 7.

The final stage amplifier circuit 3 includes a first transistor 11, a second transistor 12, a constant current circuit 13, a first high-pass filter 14, and a second high-pass filter 15. The collector of the first transistor 11 is connected to the anode of the laser diode 7 through an output terminal 1 and the matching resistance 8, while the collector of the second transistor 12 is connected to the cathode of the laser diode 7 through an output terminal 2 and the matching resistance 9. Further, the constant current circuit 13 is connected between a ground point and the emitters of the first and second transistors 11 and 12 and generates a modulation current. The first high-pass filter 14 is connected between the collector and the base of the first transistor 11, and the second high-pass filter 15 is connected between the collector and the base of the second transistor 12.

Further, the first high-pass filter 14 includes resistances 21 and 22 connected in series and a capacitance 23 connected in parallel with the resistance 22 as time constant elements. The second high-pass filter 15, on the other hand, includes resistances 24 and 25 connected in series and a capacitance 26 connected in parallel with the resistance 25 as time constant elements.

Further, the first emitter follower circuit 4 includes transistors 31 and 32 and constant current circuits 33 and 34. The collector of the transistor 31 is connected to the power supply line, and its emitter is connected to the gate of the first transistor 11. On the other hand, the collector of the transistor 32 is connected to the power supply line, and its emitter is connected to the gate of the second transistor 12. Further, the constant current circuit 33 is connected between the emitter of the transistor 31 and a ground point, while the constant current circuit 34 is connected between the emitter of the transistor 32 and a ground point. The first emitter follower circuit 4 amplifies an input signal and outputs the amplified input signal to the gates of the first transistor 11 and the second transistor 12.

Further, the amplifier circuit 5 includes load resistances 35 and 36, transistors 37 and 38, and a constant current circuit 39. The collector of the transistor 37 is connected to the power supply line through the resistance 35 and further connected to the gate of the transistor 31. On the other hand, the collector of the transistor 38 is connected to the power supply line through the resistance 36 and further connected to the gate of the transistor 32. The constant current circuit 39 is connected between a ground point and the emitters of the transistors 37 and 38.

Figure 3:
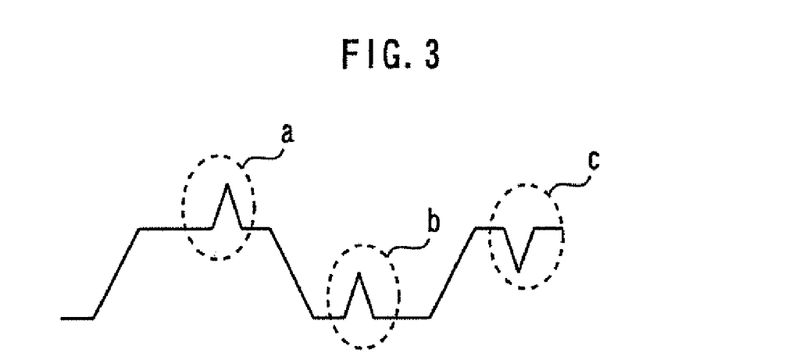
FIG. 3 is a diagram showing the potential at the output terminal 1 when noise is input.
Figure 4:
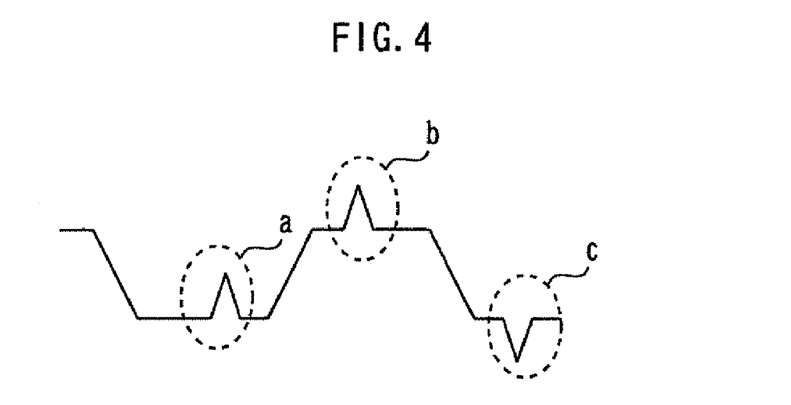
FIG. 4 is a diagram showing the potential at the gate of the first transistor 11 during the active matching operation.
Figure 5:
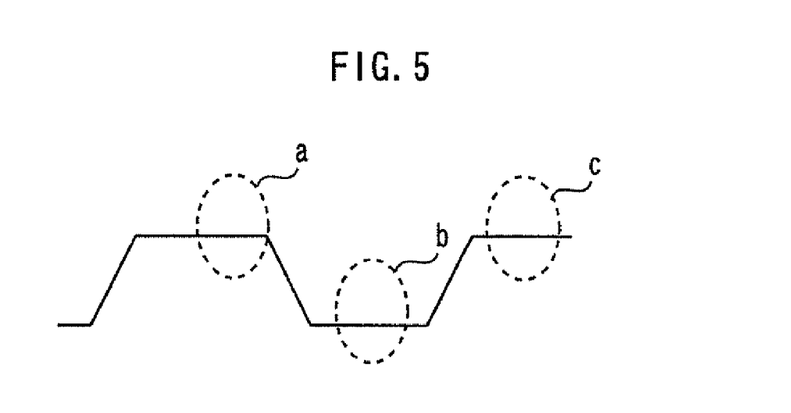
FIG. 5 is a diagram showing the potential at the output terminal 1 after the active matching operation has been performed.

The operation of the above drive circuit will now be described. FIG. 3 is a diagram showing the potential at the output terminal 1 when noise is input; FIG. 4 is a diagram showing the potential at the gate of the first transistor 11 during the active matching operation; and FIG. 5 is a diagram showing the potential at the output terminal 1 after the active matching operation has been performed. As shown in these figures, when the output terminal 1 is at a logic high level, the gate of the first transistor 11 is at a logic low level.

When a high level noise is input from the laser diode 7 to the output terminal 1, as shown in FIG. 3, the resultant potential at the output terminal 1 is higher than a predetermined high level. To overcome this problem, the high level noise signal at the output terminal 1 is delivered to the gates of the transistors 11 and 12 through a feedback path made up of the first high-pass filter 14 and the second high-pass filter 15, as shown in FIG. 4. This cancels the noise, thereby shaping the potential at the output terminal 1 to a normal level, as shown in FIG. 5.

Thus, the first and second high-pass filters 14 and 15 form a feedback path, and the first and second transistors 11 and 12 perform switching operations so as to cancel the noise input through the output terminals 1 and 2. This is called "active matching operation". It should be noted that noises b and c shown in FIG. 3 can also be canceled in the same manner.

As described above, in the drive circuit of the present embodiment, the feedback signal is fed back to the input of the final stage amplifier circuit 3, instead of the input of the first emitter follower circuit 4 as in a conventional drive circuit. Therefore, the length of the feedback path can be reduced, as compared to conventional techniques, resulting in a reduced time constant. This increases the response speed of the active matching operation to cancel noise from the laser diode, allowing for reliable cancellation of the noise. Further, it is easy to establish circuit settings identical to those in a simulation even in a high frequency range, leading to easy circuit design.

Figure 6:
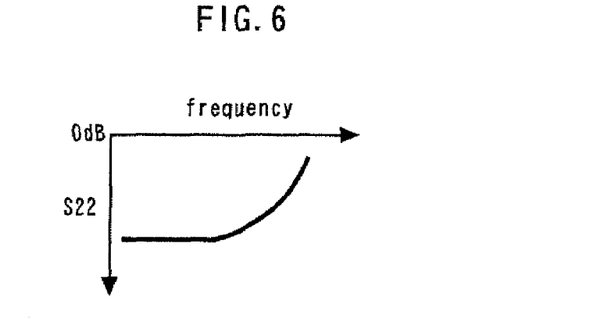
FIG. 6 is a graph showing the relationship of reflection characteristics to the frequency when a capacitance is not provided.
Figure 7:
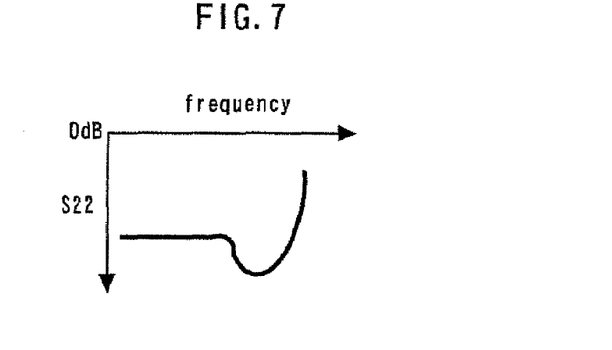
FIG. 7 is a graph showing the relationship of reflection characteristics to the frequency when each capacitance is connected in parallel with each resistance to form a high-pass filter.

The reference matching resistance value of the drive circuit is the sum of the resistance values of the transistors 11 and 12 (as seen from the output terminals 1 and 2) and the resistance values (impedances) of the resistances 21, 22, 24, and 25. This matching resistance is usually set equal to the impedance of the transmission line, that is, 25 O. However, this is not always the case. The reference characteristic impedance (or the matching resistance) may need to be varied from 25 O, depending on the specifications and characteristics of the drive circuit. When the capacitances 23 and 26 are not provided, the reflection characteristics degrade as the operating frequency increases, as indicated by reference numeral S22 in FIG. 6. To address this problem, the capacitances 23 and 26 may be connected in parallel with the resistances 22 and 25, respectively, forming high-pass filters. With this arrangement, only signals of particular frequencies are fed back from the collector to the base of each transistor 11, 12. As a result, the resistances 21, 22, 24, and 25 are effective only at particular frequencies, allowing the reflection characteristics to be improved, as shown in FIG. 7. Therefore, the circuit constants of the first and second high-pass filters 14 and 15 in the feedback path may be adjusted according to the noise frequency pattern to achieve appropriate reflection characteristics for each type of transmission line and for each frequency pattern. This means that the frequency dependence of the reflection characteristics and the level of active matching can be controlled even when using a laser diode whose characteristics widely vary or using various types of transmission lines.

Since a conventional drive circuit includes a resistance matching equal to the matching resistance of the laser diode 7, the modulation current generated by the constant current circuit 13 flows equally into the matching resistance of the laser diode 7 and the matching resistance of the drive circuit (that is, the magnitudes of the currents in these matching resistances are the same). This means that the constant current circuit 13 must generate a current twice as large as a desired modulation current. In the drive circuit of the present invention, on the other hand, the modulation current generated by the final stage amplifier circuit 3 hardly flows into the feedback path; it flows substantially into the laser diode 7. Therefore, the modulation current and hence the power consumption can be reduced, as compared to a conventional drive circuit.

Figure 8:
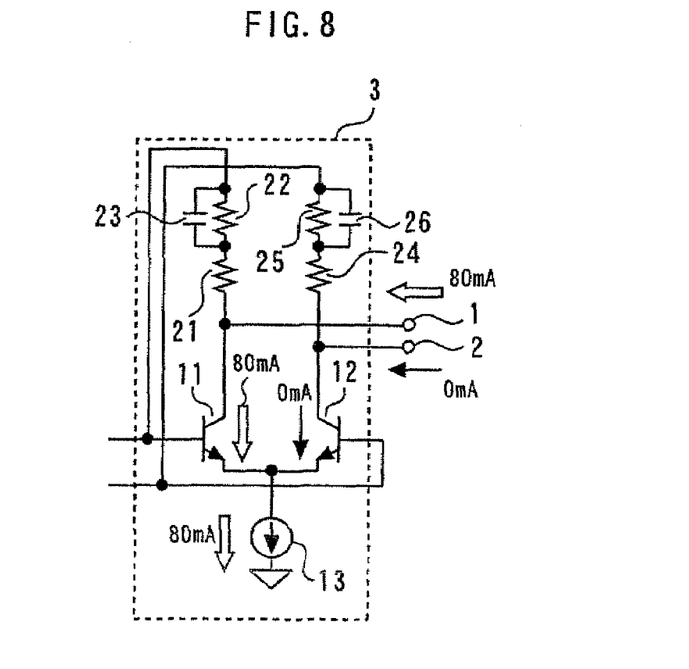
FIG. 8 is a circuit diagram showing currents flowing at each point when a constant current circuit generates a modulation current that is equal in intensity to a modulation current supplied on a laser diode side.
Figure 9:
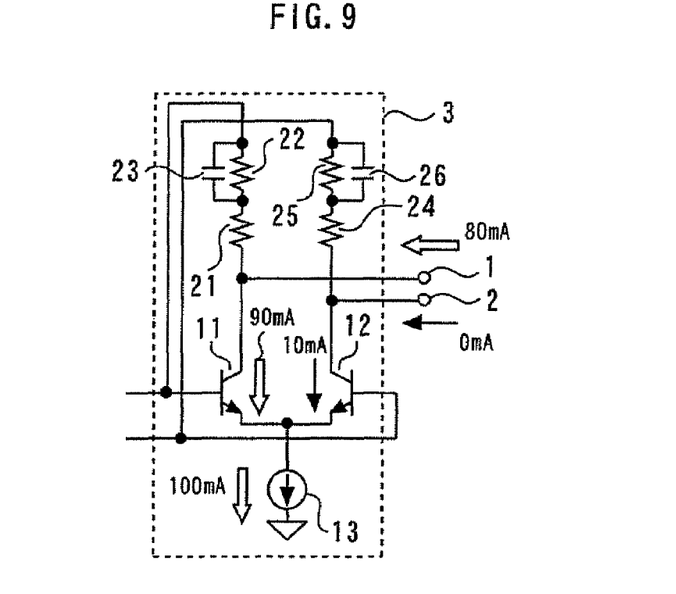
FIG. 9 is a circuit diagram showing currents flowing at each point when the constant current circuit generates a modulation current that is larger in intensity than a modulation current supplied on the laser diode side.

For example, assume that a maximum current of 80 mA need be supplied from the output terminals 1 and 2 to the laser diode 7 side. In this case, if the constant current circuit 13 is only capable of generating a current of 80 mA, the currents flowing in the transistors 11 and 12 are set to 80 mA and 0 mA, respectively, as shown in FIG. 8, That is, it is impossible to supply a current of larger than 80 mA to the transistor 11, which prevents the noise from being canceled. To avoid this, the constant current circuit 13 is adapted to generate a current larger than the modulation current supplied from the output terminals 1 and 2 to the laser diode 7 side. For example, the constant current circuit 13 may be set to generate a current of 100 mA, as shown in FIG. 9. This allows the currents in the transistors 11 and 12 to be set to 90 mA and 10 mA, respectively, providing a noise cancellation margin of 10 mA and hence increasing the resistance to noise. It should be noted that an increase in the capacity of the constant current circuit 13 results in increased power consumption.

Second Embodiment

Figure 10:
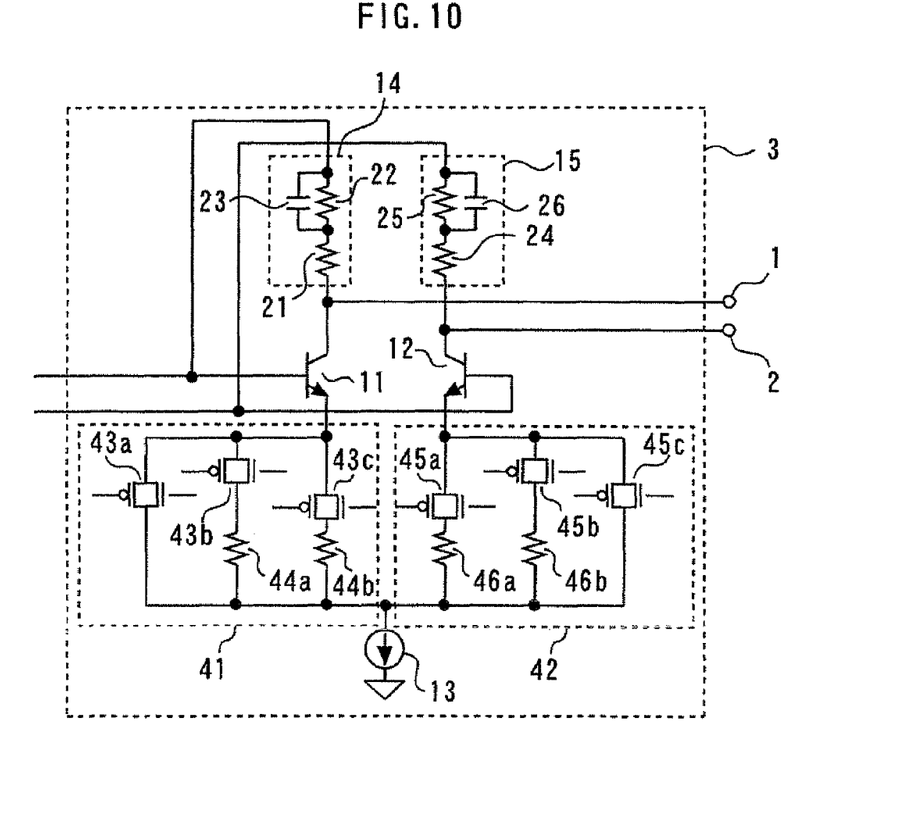
FIG. 10 is a circuit diagram showing a drive circuit according to a second embodiment of the present invention.

FIG. 10 is a circuit diagram showing a drive circuit according to a second embodiment of the present invention. This drive circuit includes variable resistances 41 and 42 provided between the emitter of the first transistor 11 and the constant current circuit 13 and between the emitter of the second transistor 12 and the constant current circuit 13, respectively. The values of the variable resistances 41 and 42 can be externally varied. All other components are similar to those described in connection with the first embodiment.

The variable resistance 41 includes transfer gates 43a to 43c connected in parallel and resistances 44a and 44b connected in series to the transfer gates 43b and 43c, respectively. Further, the variable resistance 42 includes transfer gates 45a to 45c connected in parallel and resistances 46a and 46b connected in series to the transfer gates 45b and 45c, respectively.

The matching resistance of the drive circuit can be externally adjusted by switching these transfer gates 43a to 43c and 45a to 45c even after assembling the drive circuit, transmission line, and TOSA. This allows one to finely adjust the frequency dependence of the reflection characteristics and the level of active matching (which are unlikely to match a simulation due to variations in the characteristics of the laser diode and the transmission line) after assembly, which facilitates building a system.

Third Embodiment

Figure 11:
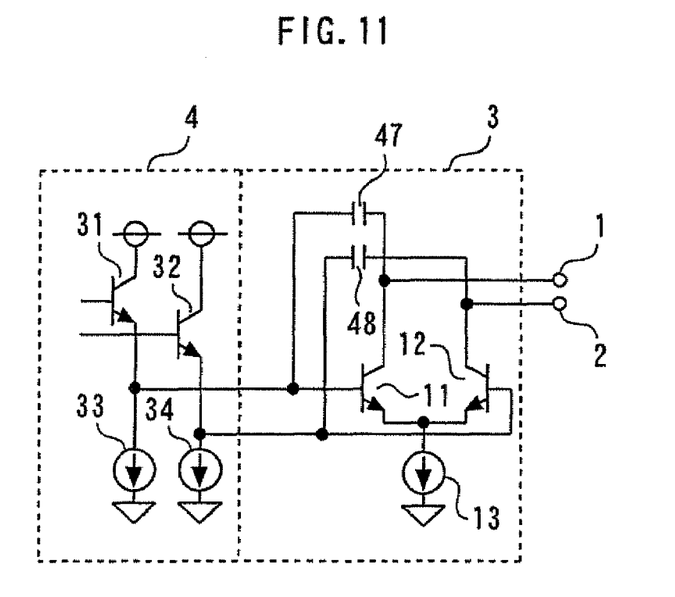
FIG. 11 is a circuit diagram showing a drive circuit according to a third embodiment of the present invention.

FIG. 11 is a circuit diagram showing a drive circuit according to a third embodiment of the present invention. Instead of the first and second high-pass filters 14 and 15, this drive circuit includes first and second capacitances 47 and 48 between the collector and the base of the first transistor 11 and between the collector and the base of the second transistor 12, respectively. All other components are similar to those described in connection with the first embodiment.

The signal flow is the same as in the first embodiment. The charging/discharging currents of the first and second capacitances 47 and 48 are used to perform an active matching operation to cancel external noise. Therefore, the drive circuit of the present embodiment has the same effect as the drive circuit of the first embodiment.

Fourth Embodiment

Figure 12:
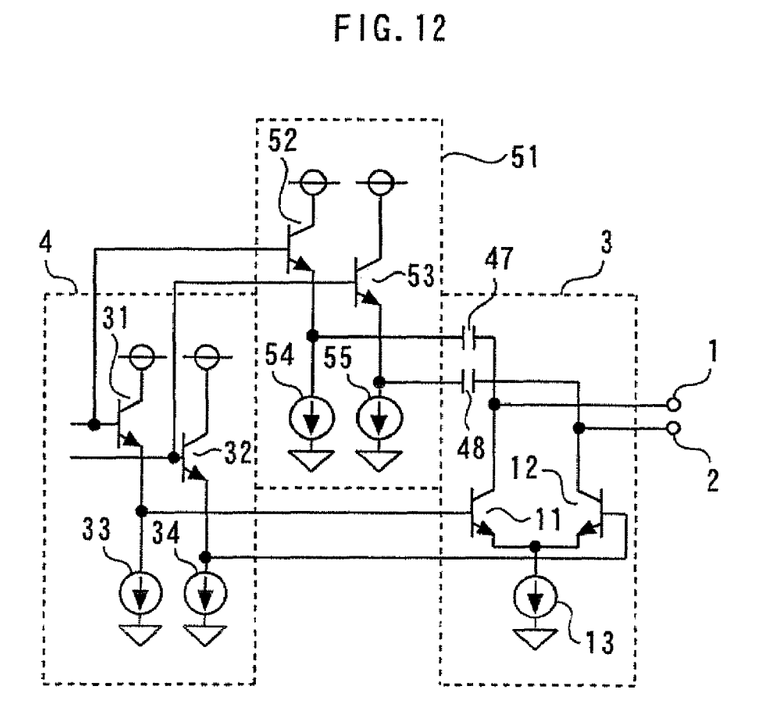
FIG. 12 is a circuit diagram showing a drive circuit according to a fourth embodiment of the present invention.

FIG. 12 is a circuit diagram showing a drive circuit according to a fourth embodiment of the present invention. This drive circuit includes: first and second capacitances 47 and 48 connected at one end to the collectors of the first and second transistors 11 and 12, respectively; and a second emitter follower circuit 51 for amplifying an input signal and outputting the amplified input signal to the other ends of the first and second capacitances 47 and 48. All other components are similar to those described in connection with the third embodiment.

The second emitter follower circuit 51 includes transistors 52 and 53 and constant current circuits 54 and 55. The collector of the transistor 52 is connected to the power supply line, and its emitter is connected to the other end of the first capacitance 47. Further, the collector of the transistor 53 is connected to the power supply line, and its emitter is connected to the other end of the second capacitance 48. The constant current circuit 54 is connected between the emitter of the transistor 52 and a ground point, and the constant current circuit 55 is connected between the emitter of the transistor 53 and a ground point.

With this arrangement, the second emitter follower circuit 51 is adapted to have a higher data transmission rate than the first emitter follower circuit 4. Specifically, a circuit constant of the second emitter follower circuit 51 is set smaller than that of the first emitter follower circuit 4, and the constant current circuits 54 and 55 have larger capacity than the constant current circuits 33 and 34.

As a result, data is transmitted at a higher rate from the second emitter follower circuit 51 to the final stage amplifier circuit 3 than from the first emitter follower circuit 4 to the final stage amplifier 3. The data from the first emitter follower circuit 4 may be overlapped with that from the second emitter follower circuit 51 at the output terminals 1 and 2 to improve the band characteristics of the drive circuit. Further, the logic high level and the logic low level do not vary much, which will result in enhanced eye pattern characteristics (Tr/Tf, etc.).

Therefore, the second emitter follower circuit 51 may perform a feed-forward preemphasis operation while an active matching operation is performed through the first and second capacitances 47 and 48. A preemphasis operation is a technique of applying peaking to an output eye pattern. This technique is applied to an amplifier, etc. having a limited frequency band in order to improve the output patterns. Further, the first and second capacitances 47 and 48 and circuit constants of the second emitter follower circuit 51 may be adjusted to adjust the frequency dependence of the reflection characteristics.

Fifth Embodiment

Figure 13:
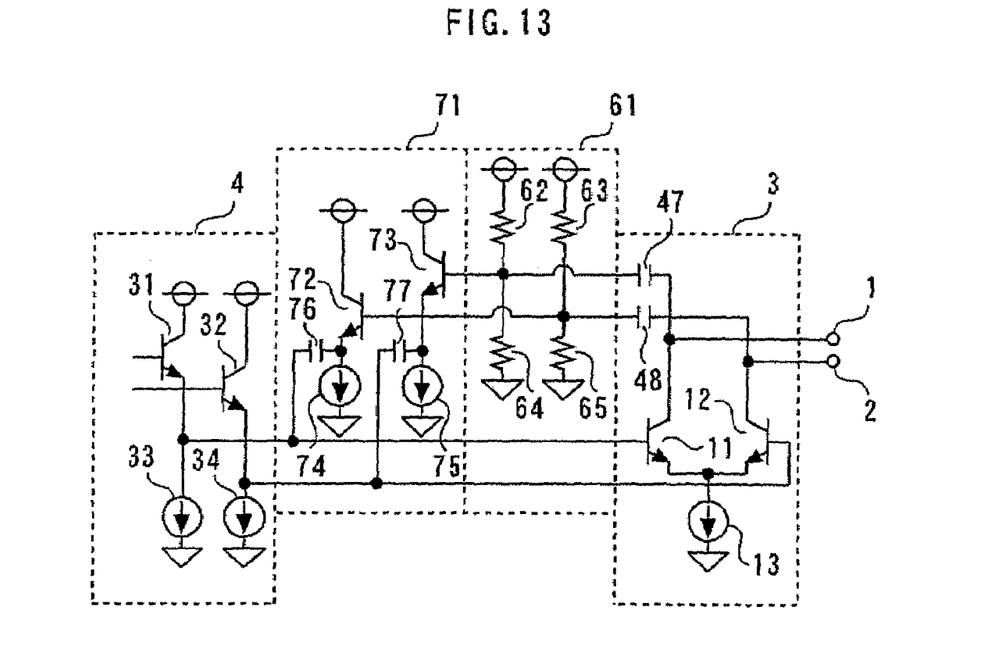
FIG. 13 is a circuit diagram showing a drive circuit according to a fifth embodiment of the present invention.

FIG. 13 is a circuit diagram showing a drive circuit according to a fifth embodiment of the present invention. This drive circuit includes: first and second capacitances 47 and 48 connected at one end to the collectors of the first and second transistors 11 and 12, respectively; a DC level regulator circuit 61; and a second emitter follower circuit 71 for amplifying signals from the other ends of the first and second capacitances 47 and 48 and outputting the amplified signals to the gates of the first and second transistors 11 and 12. All other components are similar to those described in connection with the third embodiment.

The DC level regulator circuit 61 includes resistances 62 to 65. The values of the resistances 62 to 65 determine the DC level input to the second emitter follower circuit 71.

The second emitter follower circuit 71 includes transistors 72 and 73, constant current circuits 74 and 75, and capacitances 76 and 77. The collector of the transistor 73 is connected to the power supply line, and its gate is connected to the other end of the first capacitance 47. Further, the collector of the transistor 72 is connected to the power supply line, and its gate is connected to the other end of the second capacitance 48. The constant current circuit 74 is connected between the emitter of the transistor 72 and a ground point, and the constant current circuit 75 is connected between the emitter of the transistor 73 and a ground point. Further, the capacitance 76 is connected between the emitter of the transistor 72 and the gate of the first transistor 11, and the capacitance 77 is connected between the emitter of the transistor 73 and the gate of the second transistor 12.

As in the third embodiment, an active matching operation is performed through the first and second capacitances 47 and 48. Furthermore, the emitter follower circuit 71 allows increasing the (frequency) range over which noise can be canceled, as compared to the third embodiment. Further, the first and second capacitances 47 and 48 and circuit constants of the emitter follower circuit 71 may be adjusted to adjust the frequency dependence of the reflection characteristics.

Sixth Embodiment

Figure 14:
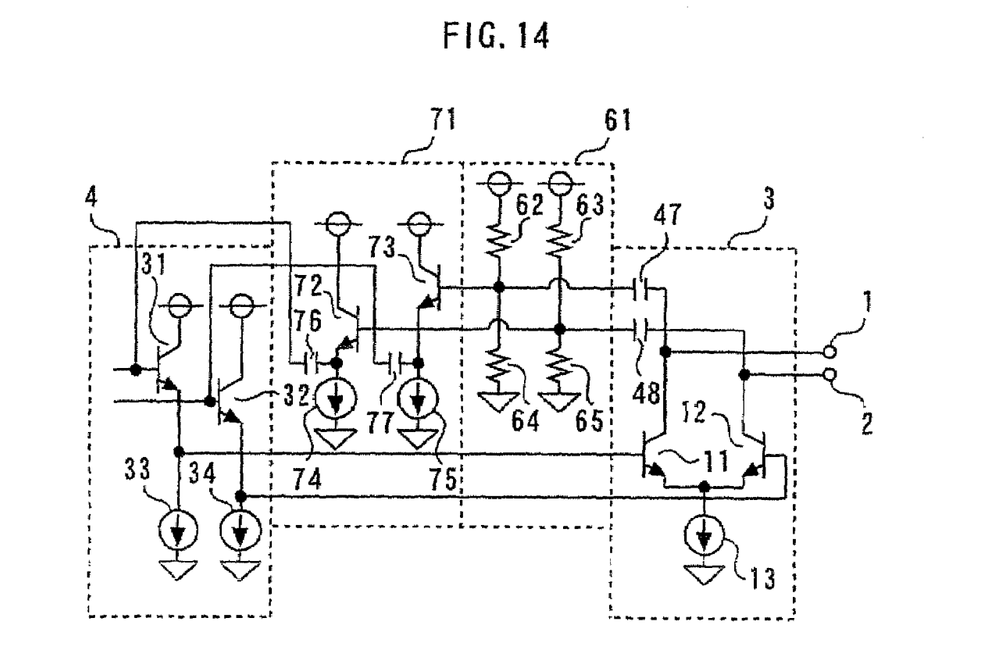
FIG. 14 is a circuit diagram showing a drive circuit according to a sixth embodiment of the present invention.

FIG. 14 is a circuit diagram showing a drive circuit according to a sixth embodiment of the present invention. In this drive circuit, the second emitter follower circuit 71 amplifies signals from the other ends of the first and second capacitances 47 and 48 and outputs the amplified signals to the input of the first emitter follower circuit 4. The capacitance 76 is connected between the emitter of the transistor 72 and the gate of the transistor 31, and the capacitance 77 is connected between the emitter of the transistor 73 and the gate of the transistor 32. All other components are similar to those described in connection with the fifth embodiment. This drive circuit can perform the same active matching operation as the drive circuit of the fifth embodiment.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2006-132234, filed on May 11, 2006 including specification, claims, drawings and summary, on which the Convention priority of the present application is based, are incorporated herein by reference in its entirety.

What is claimed is:

1. A laser diode drive circuit comprising:
   a first transistor having a collector, a base, and an emitter, the collector being arranged for connection to an anode of a laser diode;
   a second transistor having a collector, a base, and an emitter the collector being arranged for connection to a cathode of the laser diode;
   a constant current circuit connected between a ground point and the emitters of said first and second transistors;
   a first high-pass filter connected between the base and the collector of said first transistor;
   a second high-pass filter connected between the base and the collector of said second transistor; and
   first and second variable resistances, the first and second variable resistances being respectively provided between the emitters of said first and second transistors, respectively, and said constant current circuit, wherein resistance of each of the first and second variable resistance can be externally adjusted.

2. A laser diode drive circuit comprising:
   a first transistor having a collector, a base, and an emitter, the collector being arranged for connection to an anode of a laser diode;
   a second transistor having a collector, a base, and an emitter, the collector being arranged for connection to a cathode of the laser diode;
   a constant current circuit connected between a ground point and the emitters of said first and second transistors;
   a first capacitance connected between the base and the collector of said first transistor;
   a second capacitance connected between the base and said collector of said second transistor; and
   first and second variable resistances, the first and second variable resistances being respectively provided between the emitters of said first and second transistors, respectively, and said constant circuit, wherein resistance of each of the first and second variable resistances can be externally adjusted.

3. The laser diode drive circuit as in claim 1, wherein said constant current circuit drives a modulation current larger than that supplied to the laser diode.

4. The laser diode drive circuit as in claim 2, wherein said constant current circuit drives a modulation current larger than that supplied to the laser diode.

* * * * *